United States Patent
Orcutt

[19]

[11] Patent Number: 6,155,474
[45] Date of Patent: Dec. 5, 2000

[54] FINE PITCH BONDING TECHNIQUE

[75] Inventor: John W. Orcutt, Richardson, Tex.

[73] Assignee: Texas Instruments Incorporated, Dallas, Tex.

[21] Appl. No.: 09/291,302

[22] Filed: Apr. 15, 1999

Related U.S. Application Data

[62] Division of application No. 08/991,129, Dec. 16, 1997, Pat. No. 5,954,260.

[51] Int. Cl.[7] .............................. B23K 1/06; B23K 5/20; B23K 20/10; B23K 31/02
[52] U.S. Cl. ...................... 228/180.5; 228/4.5; 228/110.1
[58] Field of Search .............................. 228/1.1, 4.5, 55, 228/110.1, 180.5

[56] References Cited

U.S. PATENT DOCUMENTS

| | | | |
|---|---|---|---|
| 4,778,097 | 10/1988 | Hauser | 228/44.7 |
| 4,821,945 | 4/1989 | Chase et al. | 228/179 |
| 5,148,959 | 9/1992 | Cain et al. | 228/4.5 |
| 5,485,949 | 1/1996 | Tomura et al. | 228/180.5 |
| 5,544,804 | 8/1996 | Test et al. | 228/180.5 |
| 5,558,270 | 9/1996 | Nachon et al. | 228/180.5 |

FOREIGN PATENT DOCUMENTS 410189647  7/1998  Japan .

*Primary Examiner*—Patrick Ryan
*Assistant Examiner*—Kiley Stoner
*Attorney, Agent, or Firm*—Wade James Brady, III; Frederick J. Telecky, Jr.

[57] ABSTRACT

A capillary for bonding a wire between two bonding locations which comprises a capillary (1) having a body having an exterior surface, a bore (23) therethrough and a wall disposed between and defined by the bore and the exterior surface, the bore terminating at an end portion (9) of said body. The wall has at one end portion thereof first (21) and second opposing sectors spaced from each other by third and fourth opposing sectors (31), the first sector having a thickness greater than the rest of the sectors and the second sector having a thickness intermediate the first sector and the third and fourth sectors. A first bond, generally a ball bond (3), is formed at a first bonding location with the capillary. The capillary is moved to a second bonding location and a stitch bond is formed at the second location while the portion of the capillary of greater thickness is downstream of the path of travel of the capillary while making the stitch bond.

10 Claims, 2 Drawing Sheets

FINE PITCH BONDING TECHNIQUE

CROSS REFERENCE TO PRIOR APPLICATION

This application is a division of Ser. No. 08/991,129, filed Dec. 16, 1997 for Fine Pitch Bonding Technique, now U.S. Pat. No. 5,954,260.

BACKGROUND OF THE INVENTION

1. Field of the Invention

This invention relates to a capillary and procedure for bonding wire to a bonding surface, particularly in conjunction with semiconductor devices.

2. Brief Description of the Prior Art

In the fabrication of semiconductor devices, wiring between two bond pads on a chip or between a bond pad on the chip and an external bonding location, such as a lead frame, is generally performed by making a ball bond on one bonding pad at one end of a wire fed from a spool and then making a stitch bond at the other end of the wire. The wire is also severed from the spool from which it has been fed at the stitch bond location. Such bonding and wire severing is generally performed with the aid of a capillary through which the wire to be bonded is passed from the wire spool. The procedure is to form a ball from a portion of the wire which extends out of the capillary, bond the ball to a bond pad and move the capillary to the second bond pad with the wire being fed out through the capillary during travel of the capillary to the second bond pad. The wire is then stitch bonded to the second pad, usually a lead finger, and prepared for severing from the spool, using the nose of the capillary to perform these tasks.

In order for the capillary to perform the function of stitch bonding, the capillary must apply a force against the wire which rests on the bond pad. In order to perform this task without fracture of the capillary, as a first condition, the capillary wall must have sufficient thickness to withstand the forces applied thereto at the location of force application during the stitch bonding procedure. This has been accomplished in the prior art by providing a wire bonding capillary with central bore or aperture, a circular cross section and wall thickness from exterior surface to central bore sufficient to accomplish the above described purpose and withstand the forces thereon.

With the continual decrease in the spacing dimensions between wire bonding locations, particularly in the semiconductor art, the problem of bonding wire to a wire bonding surface with a capillary and then moving the capillary to a new location without interference with adjacent wire bonding locations and wires bonded at adjacent wire bonding locations has increased. As the dimensions decrease, the possibility that the capillary will interfere with or strike an adjacent bond pad or wire extending from an adjacent bond pad in its travel from one bonding location to a second bonding location increases.

A prior art technique that has been developed to accommodate and/or minimize this problem has utilized a capillary with the diameter of the nose portion decreased. This results in a reduction of capillary wall thickness and provides a poor stitch bond. Accordingly, this technique is undesirable.

A further prior art technique that has been developed to accommodate and/or minimize this problem has utilized a wire bonding capillary of circular cross section with a portion of the capillary wall on a pair of opposing sides of the capillary removed to provide an indentation thereat. Capillaries of this type are provided by Texas Instruments Incorporated under the trademark BowTI™. This is accomplished by using a capillary having a nose or stitch face somewhat in the shape of a figure "8" with a hollow center to carry the wire as in the prior art and with an enlarged but thin walled waist region. A capillary with this shape is still capable of performing the functions of forming and bonding the ball from the wire passing therethrough at one pad and then stitch bonding the wire at a second pad, using the thicker-walled portion of the "8"-shaped capillary. The top and bottom portions of the "8" must be used to make the stitch bond because they are thicker and better capable of withstanding the forces applied to the capillary during stitch bonding. With a capillary having the above described shape, when bonds are to be made concurrently at adjacent bond location, the adjacent bonds are made with the capillaries rotated by 90° relative to each other so that the circular portion of one capillary fits into but is separated from the waist portion of the adjacent capillary. As is apparent, the bond spacing can be materially decreased with the above described technique. After ball bonding one end of the wire extending from the capillary, the capillary with wire therein is moved to the next bonding location during which time the wire is passed through the capillary. The other end of the wire just bonded is then stitch bonded at the next bonding location using the thicker portions of the capillary to make the stitch bond.

However, often, due to the yet smaller dimensions now being introduced and contemplated for the future, the direction of capillary travel from one bonding location to the next bonding location can still be presented with an impediment from the circular portions of the "8"-shape. This impediment can again be caused by the wires extending from an adjacent bond location in that the "8"-shaped capillary may strike the adjacent wires when travelling to the next bond location. It is necessary that the capillary not come in contact with the adjacent bond just made or being made or with the wire extending therefrom in order to avoid damage to one of the bonds or wires in question. This is often a problem due to the close proximity of adjacent bonds.

One way to minimize this problem is to further decrease the dimensions of the stitch face of the capillary. However this approach presents the problem of capillary breakage and poor stitch bond strength when forming the stitch bond as discussed above with the prior art. It is therefore apparent that a different solution to this problem is necessary.

SUMMARY OF THE INVENTION

In accordance with the present invention, the above noted problem is minimized without alteration of the dimension of one ball portion or the waist of the prior art "8"-shaped capillary.

Briefly, the above is accomplished by providing a capillary in the shape of half of the prior art figure "8" embodiment discussed hereinabove and also including the entire or most of the waist section and omitting one of the circular sections. The resulting capillary is a body having an exterior surface with a bore therethrough and a wall disposed between and defined by the bore and the exterior surface, the bore terminating at an end portion of the body. The thickness of the wall along a cross section normal to the bore is much greater along a minor sector of the wall extending from the bore, the minor sector being on the order of ninety degrees, this dimension not being critical. The ball is initially formed with the stitch bond forming portion being positioned during ball bonding in a position so that it extends in the direction away from the location of the stitch bond to be formed. Upon providing the ball bond, the capillary can then be raised without coming into contact with the wires from the adjacent pads which generally travel in the same direction because no portion of the capillary will then be located adjacent a wire. It is therefore apparent that if the ball portion of the capillary is rearward of the direction of capillary movement to the next bond location, the ball portion cannot present an impediment to the direction of capillary travel.

BRIEF DESCRIPTION OF THE DRAWINGS

FIG. 2b is a perspective view of the capillary of FIG. 2a;

FIG. 3c is a perspective view of the capillary of FIG. 3a;

FIG. 4b is a perspective view of the capillary of FIG. 4a.

DESCRIPTION OF THE PREFERRED EMBODIMENT

Figure 1:
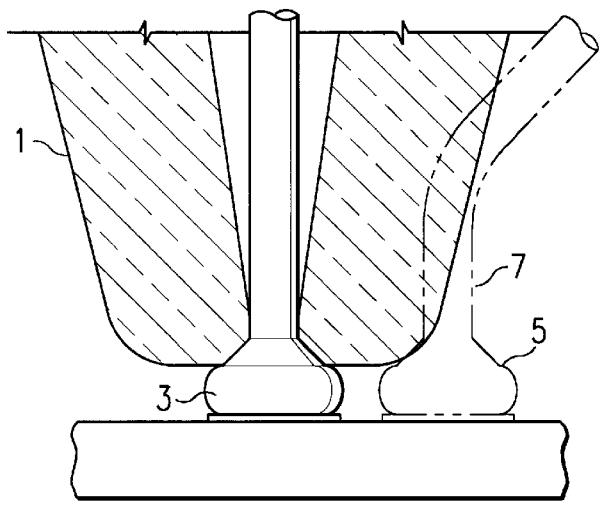
FIG. 1 is a cross sectional view of first wire bond capillary in accordance with the prior art.

Referring first to FIGS. 1a and 1b, there is shown a standard prior art bond capillary 1 forming a ball bond 3 with a closely adjacent bond 5 and bonded wire 7. As can be seen in FIG. 1a, the capillary 1 strikes the adjacent wire 7 when forming the ball bond.

Figure 2A:
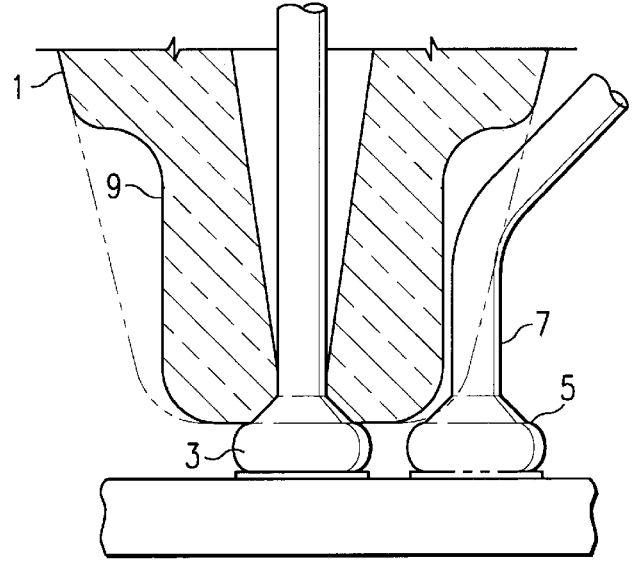
FIG. 2a is a cross sectional view of a second wire bond capillary in accordance with the prior art.
Figure 2B:
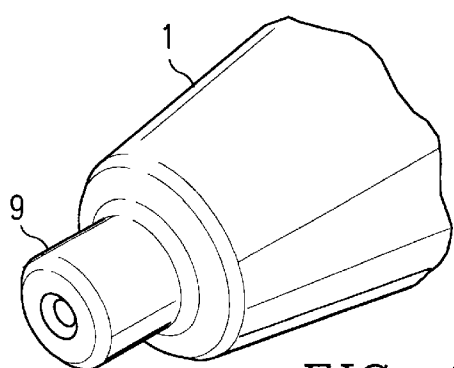

Referring to FIGS. 2a and 2b, there is shown a prior art proposed solution to the problem in FIG. 1a wherein the nose 9 of the capillary has a reduced outside diameter to accommodate the reduced dimensions between bonds and wires. As stated above, a capillary of this type breaks easily when subjected to the forces required for stitch bonding and is therefore not a viable solution to the problem.

Figure 3A:
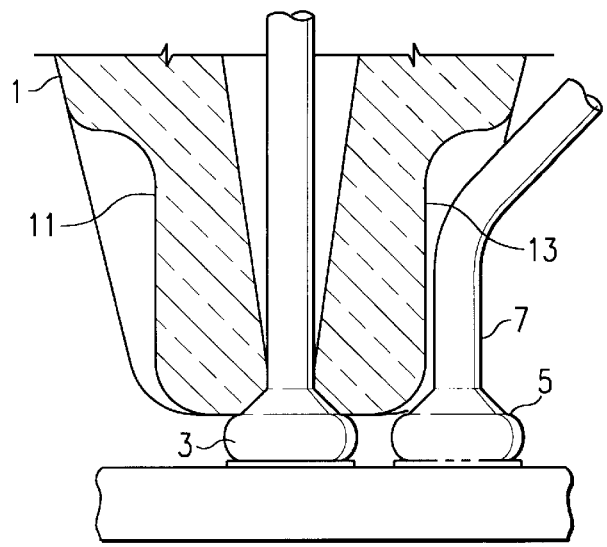
FIG. 3a is a cross sectional view of a third wire bond capillary in accordance with the prior art.
Figure 3B:
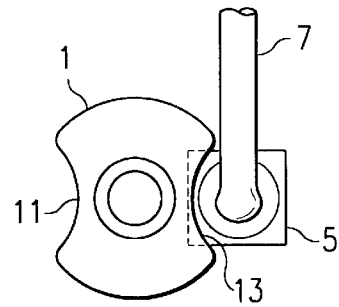
FIG. 3b is a schematic drawing of the capillary of FIG. 3a making a bond next to a bond pad with an already bonded wire thereat.
Figure 3C:
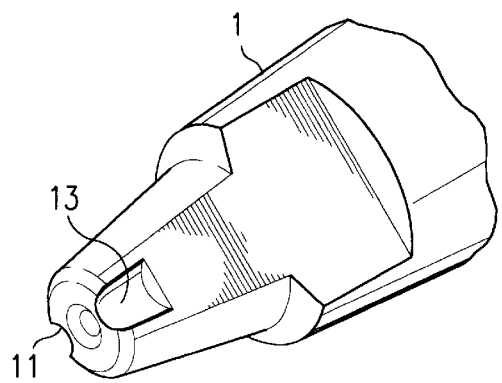

Referring now to FIGS. 3a to 3c, there is shown the prior art BowTI™ capillary discussed above. As can be seen, a portion of the nose has been removed at 11 and 13 so that the capillary fits around an adjacent bond pad and wire at its waist as shown in FIG. 3b.

Figure 4A:
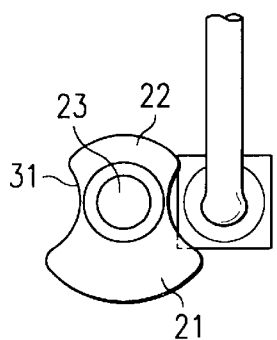
FIG. 4a is a schematic drawing of the capillary in accordance with the present invention making a bond next to a bond pad with an already bonded wire thereat.
Figure 4B:
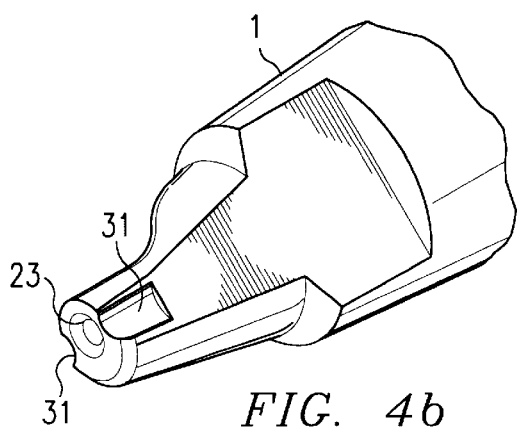

Referring now to FIGS. 4a and 4b, there is shown the capillary in accordance with the present invention. The shape of the capillary has been altered so that the nose portion 21 remains as in FIG. 3b and tab or waist portion 31 extends therefrom with the capillary bore 23 terminating in the tab portion. As can be seen in FIGS. 4a and 4b, by removal of a portion of one of the nose portions 22 from the prior art capillary of FIGS. 3a to 3c, the removed portion of the capillary is no longer present to provide a potential impediment in the capillary travel path. It should be understood that only the working end including the nose portion of the capillary is shown in FIGS. 4a and 4b and that the remainder of the capillary can assume any cross sectional shape and would preferably be circular.

In operation, the capillary is first moved to a location over a bond pad on which a ball bond is to be formed with the ball at the end of the wire extending out of the bore 23. The wire is fed through the bore 23 and the ball is formed and affixed to the bond pad. The capillary 1 is then lifted so that the nose portion 22 is located forward of the nose portion 21 in the direction of capillary movement and leads the capillary during such capillary movement when the capillary is being moved to the second bond location. The wire is then stitch bonded at the second location using the nose portion 21 to make the stitch bond. The nose portion 21 has sufficient thickness to withstand the pressures applied during stitch bonding without breakage while providing a capillary nose portion of minimal dimensions.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modification.

What is claimed is:

1. A method of bonding a wire between two bonding locations comprising the steps of:

(a) providing a capillary having a body having an exterior surface and an end portion, a bore through said capillary and a wall disposed between and defined by said bore and said exterior surface, said bore terminating at said end portion of said body, said wall having at one end portion thereof first and second opposing sectors spaced from each other by third and fourth opposing sectors, one of said sectors having a thickness greater than the rest of said sectors; and (b) forming a stitch bond with the sector of said capillary having a greater thickness than the rest of said sectors.

2. The method of claim 1 wherein said sector opposing said one of said sectors has a thickness intermediate said one of said sectors and the others of said sectors.

3. The method of claim 1 further including the steps of forming a first bond at a first bonding location with said capillary and then moving said capillary to a second bonding location to form said stitch bond.

4. The method of claim 3 wherein said sector opposing said one of said sectors has a thickness intermediate said one of said sectors and the others of said sectors.

5. The method of claim 3 further including the step of positioning said sector having a thickness greater than the rest of said sectors downstream of the path of travel of said capillary while said capillary is making said stitch bond.

6. The method of claim 5 wherein said sector opposing said one of said sectors has a thickness intermediate said one of said sectors and the others of said sectors.

7. The method of claim 5 wherein said first bond is a ball bond.

8. The method of claim 7 wherein said sector opposing said one of said sectors has a thickness intermediate said one of said sectors and the others of said sectors.

9. The method of claim 3 wherein said first bond is a ball bond.

10. The method of claim 9 wherein said sector opposing said one of said sectors has a thickness intermediate said one of said sectors and the others of said sectors.

* * * * *